United States Patent
Basol et al.

[11] Patent Number: 5,985,691
[45] Date of Patent: Nov. 16, 1999

[54] METHOD OF MAKING COMPOUND SEMICONDUCTOR FILMS AND MAKING RELATED ELECTRONIC DEVICES

[75] Inventors: Bulent M. Basol, Manhattan Beach; Vijay K. Kapur, Tarzana; Arvind T. Halani, Northridge; Craig R. Leidholm, Woodland Hills; Robert A. Roe, Glendale, all of Calif.

[73] Assignee: International Solar Electric Technology, Inc., Inglewood, Calif.

[21] Appl. No.: 08/857,665

[22] Filed: May 16, 1997

[51] Int. Cl.$^6$ .............................. H01L 21/00; H01L 31/18
[52] U.S. Cl. ............................................................ 438/95
[58] Field of Search ........................ 438/93, 95; 427/74, 427/76; 136/260, 265; 205/109, 176, 191

[56] References Cited

U.S. PATENT DOCUMENTS

| | | |
|---|---|---|
| 4,465,575 | 8/1984 | Love et al. . |
| 4,581,108 | 4/1986 | Kapur et al. . |
| 4,721,539 | 1/1988 | Ciszek . |
| 4,798,660 | 1/1989 | Ermer et al. . |
| 4,940,604 | 7/1990 | Suyama et al. . |
| 5,028,274 | 7/1991 | Basol et al. . |
| 5,356,839 | 10/1994 | Tuttle et al. . |
| 5,441,897 | 8/1995 | Noufi et al. . |
| 5,445,847 | 8/1995 | Wada et al. . |
| 5,501,786 | 3/1996 | Gremion et al. . |
| 5,538,903 | 7/1996 | Aramoto et al. . |
| 5,731,031 | 3/1998 | Bhattacharya et al. . |

FOREIGN PATENT DOCUMENTS

| | | |
|---|---|---|
| 0595115A1 | 5/1994 | European Pat. Off. . |
| WO 94/07269 | 3/1994 | WIPO . |

OTHER PUBLICATIONS

"Studies on CuIn Precursor for the Preparation of CuInSe$_2$ Thin Films by the Selenization Technique", Gupta A. et al., *Solar Energy Materials and Solar Cells*, pp. 137–149 (1994).

"Characterization of Co–Sputtered Cu–In Alloy Precursors for CuInSe2 Thin Films Fabrication by Close–Spaced Selenization", Adurodija F.O., et al., *Solar Energy Materials and Solar Cells*, pp. 225–236 (1988).

"Screen Printing of CIS Films for CIS–CdS Solar Cells", A. Vervaet et al., *Proceedings of the 10$^{th}$ European Photovoltaic Solar Energy Conference*, pp. 900–903 (1991).

(List continued on next page.)

*Primary Examiner*—Chandra Chaudhari
*Assistant Examiner*—Martin Sulsky
*Attorney, Agent, or Firm*—Fulwider Patton Lee & Utecht, LLP

[57] ABSTRACT

A method of forming a compound film includes the steps of preparing a source material, depositing the source material on a base to form a precursor film, and heating the precursor film in a suitable atmosphere to form a film. The source material includes Group IB-IIIA alloy-containing particles having at least one Group IB-IIIA alloy phase, with Group IB-IIIA alloys constituting greater than about 50 molar percent of the Group IB elements and greater than about 50 molar percent of the Group IIIA elements in the source material. The film, then, includes a Group IB-IIIA-VIA compound. The molar ratio of Group IB to Group IIIA elements in the source material may be greater than about 0.80 and less than about 1.0, or substantially greater than 1.0, in which case this ratio in the compound film may be reduced to greater than about 0.80 and less than about 1.0. The source material may be prepared as an ink from particles in powder form. The alloy phase may include a dopant. Compound films including a Group IIB-IVA-VA compound or a Group IB-VA-VIA compound may be substituted using appropriate substitutions in the method. The method, also, is applicable to fabrication of solar cells and other electronic devices.

35 Claims, 7 Drawing Sheets

OTHER PUBLICATIONS

Patent Abstracts of Japan, vol. 013, No. 114, Mar. 20, 1989 & JP 63 285974 A (Taizo Irie;Others: 01), Nov. 22, 1988.

"Thin Film Solar Cells", Bloss et al., *Progress in Photovoltaics*, 3:3–24 (1995).

"$CuInSe_2$ Thin Film Solar Cells By Pulsed Laser Deposition", Dittrich et al., *23rd IEEE PV Specialists Conference*, p. 617 (1993).

$CuInSe_2$ Films Prepared by Screen–Printing and Sintering Method, Arita et al., *20th IEEE Photovoltaic Specialists Conference*, p. 1650 (1988).

"Screen Printing of $CuInSe_2$ Films", Vervaet et al., *9th European Communities Photovoltaic Solar Energy Conference*, p. 480 (1989).

"Screen Printed and Sintered $CuInSe_2$ Based Chalcopyrite Layers for Solar Cells", Casteleyn et al., *12th European Photovoltaic Solar Energy Conference*, p. 604 (1994).

CRC Handbook of Chemistry and Physics, *CRC Press, Inc.*, $72^{nd}$ edition (1991–1992).

"$CuInSe_2$ Film Formation From Sequential Depositions of In(Se):Cu:Se", Kessler et al., $12^{th}$ *European Communities Photovoltaic Solar Energy Conference*, p. 648 (1994).

"Flexible and light weight copper indium diselenide solar cells on polyimide substrates", Basol et al., *Solar Energy Materials and Solar Cells*, 43:93–98 (1996).

METHOD OF MAKING COMPOUND SEMICONDUCTOR FILMS AND MAKING RELATED ELECTRONIC DEVICES

This invention was made with United States Government support under Department of Energy Contract No. DE-FG03-96ER82191/A000. The United States Government has certain rights in this invention.

FIELD OF THE INVENTION

The present invention relates to methods of making structures incorporating ternary and higher order compound semiconductors, to such structures, and to electronic devices including such structures.

BACKGROUND OF THE INVENTION

Photovoltaics is concerned with direct conversion of light or solar energy into electricity through the use of active electronic devices called solar cells. Solar cells are commonly fabricated on wafers of polycrystalline or single crystal silicon. However, the cost of electricity generated using silicon-based solar cells is rather high, compared to electricity available from typical electrical power system grids. The production cost of the photovoltaic product is often represented in units of dollars per watt generated under standard 100 $mW/cm^2$ illumination intensity.

To make thin film solar cell technology competitive with common silicon-based photovoltaic products and with the traditional methods of electric power generation, a film growth technique has to be developed that can deposit solar cell grade, electronically active layers of the absorber materials and other components of the solar cells on large area substrates, using cost effective approaches with high throughput and high materials utilization. Therefore, there has been a continuous effort to develop low cost solar cells, based on thin film polycrystalline compound semiconductor absorber layers.

Group IB-IIIA-VIA materials are promising as the absorber layers of high efficiency thin film solar cells. In fact, a comparatively high efficiency thin film device has already been produced on a $Cu(In,Ga)Se_2$ absorber film grown by a vacuum evaporation technique. A demonstrated conversion efficiency of over 17% confirmed the capability of this material to yield quite efficient active devices when employed in thin film solar cell structures.

The electrical and optical properties of Group IB-IIIA-VIA compound films depend on their chemical composition, defect chemistry and structure, which in turn are related to the film growth techniques and parameters. There are a variety of deposition techniques that have been used for the growth of Group IB-IIIA-VIA compound semiconductor films. However, it is crucial to obtain a material that has the good opto-electronic and structural properties which are needed for the production of active electronic devices such as solar cells.

In solar cells based on a Group IB-IIIA-VIA absorber film, appreciable amounts of the binary phases, such as Group IIIA-VIA compounds and especially Group IB-VIA compounds, in the absorber film, typically deteriorate the electronic properties of the compound, and thus the characteristics of the solar cells. In addition, it is considered desirable to have an absorber material with columnar grains equivalent to at least about 0.5 $\mu$m diameter, in thin film solar cell structures. Furthermore, for commercial viability, the technique should be able to deposit a layer that is relatively uniform compositionally onto very large substrates, such as several $ft^2$ in area, using low cost equipment and processes.

A significant compositional parameter of Group IB-IIIA-VIA thin films is the molar ratio of the Group IB element or elements to the Group IIIA element or elements. This is commonly referred to as the I/III ratio. Typically an acceptable range of the I/III molar ratio for the Cu-containing solar cell using Group IB-IIIA-VIA materials is about 0.80–1.0, although in some cases involving extrinsic doping with a dopant such as Na, this ratio can go even lower to about 0.6. If the I/III ratio exceeds 1.0, a low resistivity copper selenide phase typically precipitates and deteriorates the performance of the device.

One technique that has yielded relatively good quality Group IB-IIIA-VIA films for solar cell fabrication is co-evaporation of Group IB, IIIA and VIA elements onto heated substrates. As described by Bloss et al. in their review article ("Thin Film Solar Cells", *Progress in Photovoltaics*, vol. 3, pages 3–24, 1995), the film growth in this technique takes place in a high vacuum chamber and the evaporation rates of the Group IB and Group IIIA elements are carefully controlled to keep the overall I/III ratio of the film in the acceptable range.

However, the evaporation method is not readily adaptable to low cost production of large area films, mainly because uniform deposition by evaporation on large area substrates is difficult, and the cost of vacuum equipment is high. Co-sputtering of Group IB and Group IIIA elements such as Cu and In the presence of Group VIA vapors such as Se, has also been investigated as a possible method of compound film growth. However, this technique suffers from yield problems, most probably due to poor capability to control the I/III ratio.

Another technique for growing Group IB-IIIA-VIA compound thin films for solar cells is a two-stage process where at least two components of the Group IB-IIIA-VIA material are first deposited onto a substrate, and then reacted with each other and/or with a reactive atmosphere in a high temperature annealing process. U.S. Pat. No. 4,581,108 issued to Vijay K. Kapur et al. in 1986, U.S. Pat. No. 4,798,660 issued to James H. Ermer et al. in 1989, and U.S. Pat. No. 5,028,274 issued to Bulent M. Basol et al. in 1991 teach respectively the methods of electrodeposition of Group IB and IIIA elements onto a substrate followed by selenization or sulfidation, DC magnetron sputtering of Cu and In layers on a substrate followed by selenization, and deposition of Group IB and IIIA elements onto a substrate previously coated with a thin Te film followed by selenization or sulfidation.

In the two-stage processes, large area magnetron sputtering techniques can be used to deposit individual layers containing Group IB and Group IIIA elements for precursor film preparation. In the case of $CuInSe_2$ growth, for example, Cu and In layers can be sputter-deposited on non-heated substrates and then the composite film can be selenized in $H_2Se$ gas or Se vapor at an elevated temperature, as is shown in U.S. Pat. Nos. 4,798,660 and 5,028,274.

The film growth techniques require strict control of the material composition during the deposition process, with a typical goal that in the final film, the overall I/III ratio be in the acceptable range of about 0.80–1.0. For mass production of photovoltaic modules, this ratio should be uniform over large area substrates. In the two- stage processes the uniformity and thickness of each layer has to be controlled.

When the I/III ratio is greater than 1.0, it causes the separation of a Cu-selenide phase in Group IB-IIIA-VIA compound layers. Layers containing Cu-selenide phase have low resistivities and typically are not used in active device fabrication. However, these Cu-rich films have good structural characteristics and large grain sizes. The relationship between the structural properties of Group IB-IIIA-VIA materials and their composition can be used beneficially, especially in the co-evaporation approaches, by intentionally increasing the I/III ratio above 1.0 during the film growth process for improving the structural properties of the growing film, and then decreasing it back to the acceptable range by the time the deposition process is terminated. Films grown by such approaches often have large grain sizes and good electronic properties. Therefore, it is typically allowable to change the I/III ratio during the deposition and growth of a Group IB-IIIA-VIA compound, but with the overall ratio in the final film being within the 0.80–1.0 range.

Since the uniformity and control of the I/III ratio throughout the material is important for Group IB-IIIA-VIA compounds, attempts have been made to fix this ratio in a material, before the deposition process, and then transfer this fixed composition into the thin film formed using the material. Early attempts for $CuInSe_2$ growth by such an approach were by evaporation and by sputtering, using pre-formed $CuInSe_2$ compound material as the evaporation source or the sputtering target. However, these efforts did not yield solar cell grade material because of the lack of reproducible compositional control, which may have resulted from Se and/or $In_2Se$ loss in the vacuum environment. In the case of sputtering, the changing nature of the target surface also presented a problem. A relatively efficient solar cell was recently demonstrated on a layer obtained by laser ablation of a $CuInSe_2$ target (H. Dittrich et al., 23rd *IEEE PV Specialists Conference*, 1993, page 617), however, such an approach is not practical for large scale production.

Other attempts to prepare Group IB-IIIA-VIA compound films using a material with a pre-fixed composition have included screen printing layers onto substrates and their conversion into the compound. T. Arita et al. in their 1988 publication (20th *IEEE PV Specialists Conference*, 1988, page 1650) described a screen printing technique that involved: creating an initial material by mixing pure Cu, In and Se powders in the compositional ratio of 1:1:2, milling these powders in a ball mill and forming a screen printable paste, screen printing the paste on a substrate, and sintering this precursor film to form the compound layer. The milling was done in a media such as water or ethylene glycol monophenyl ether to reduce the particle size, and formation of a paste was done using a propylene glycol binder. The paste material was deposited on a high temperature borosilicate glass substrate by the screen printing method, forming a film. The post-deposition treatment step consisted of annealing the film in nitrogen gas at 700° C., to form a compound film on the substrate.

For evaluating the photovoltaic characteristics of the resulting compound, thick pellets were made from the material obtained as a result of the milling and sintering steps, and solar cells were fabricated on them. Efficiencies of only about 1% were reported for these devices. The researchers further reported that $CdS/CuInSe_2$ thin film junctions were also fabricated by depositing CdS film on the sintered $CuInSe_2$ films by RF sputtering, but concluded that they were not able to obtain better photovoltaic characteristics than that in pellet samples. Their reported data indicated that In powder was oxidized during the milling process, that Cu, In and Se were reacting with each other during milling, and that the $CuInSe_2$ material obtained after the sintering process had a resistivity of about 1.0 ohm-cm. This resistivity is only about 0.01–1% of the value for a typical $CuInSe_2$ film that yields efficient solar cells and may indicate the presence of a detrimental Cu—Se phase. Also, the sintering temperature of 700° C. is very high for low cost solar cell structures that employ soda-lime glass substrates.

Thin layers of $CuInSe_2$ deposited by a screen printing method were also reported by a research group at Universiteit Gent in Belgium. A. Vervaet et al., in their 1989 publication (9th *European Communities PV Solar Energy Conference*, 1989, page 480), referring to the work of T. Arita et al., indicated that indium powder easily oxidizes, giving rise to unwanted phases, such as $In(OH)_3$ or $In_2O_3$ in the final films. The technique of the Universiteit Gent research group, therefore, employed the steps of: forming a $CuInSe_2$ powder as an initial material by crushing a $CuInSe_2$ ingot; grinding the $CuInSe_2$ powder in a ball mill; adding excess Se powder and other agents such as 1,2-propanediol into the formulation to prepare a screen printable paste; screen printing layers onto borosilicate and alumina substrates; and high temperature sintering of the layers (above 500° C.) to form the compound films. A difficulty in this approach was finding a suitable sintering aid or fluxing agent for $CuInSe_2$ film formation. Among many agents studied, copper selenide was the best for grain growth, but films containing this phase could not be used for active device fabrication since they had I/III ratios larger than 1.0.

More recently, the Universiteit Gent group experimented with $CuTlSe_2$, a compound with a relatively low (about 400° C.) melting point, as a fluxing agent. In their 1994 publication (12th *European PV Solar Energy Conference*, 1994, page 604), M. Casteleyn et al., used $CuTlSe_2$ in their formulation of the $CuInSe_2$ paste, and demonstrated grain growth for films with I/III ratios in an acceptable range. However, the solar cells fabricated on the resulting layers were still poor with conversion efficiencies of only of about 1%. The sintering temperature of above 600° C. used in this process was also high for low cost glass substrates. Using $CuInSe_2$ powder as the initial material did not produce good results because of the lack of a good sintering aid that would not deleteriously affect the electronic properties of the final film obtained by this technique. The sintering temperature employed in the above referenced screen printing techniques was very high (>600° C.) for the use of low cost substrates for the deposition of Group IB-IIIA-VIA compound films.

In addition to difficulties associated with controlling the macro-scale uniformity of the I/III ratio over large area substrates, there are also concerns involving micro-scale non-uniformities in Group IB-IIIA-VIA compound thin films. In U.S. Pat. No. 5,445,847, issued to T. Wada et al. in 1995, the researchers treated a Group IB element layer and a Group IIIA element layer with heat under the presence of the chalcogen to obtain a chalcopyrite-type compound. They observed a deviation in a composition ratio of the Group IB element to the Group IIIA element in the obtained compound, and stated that the composition itself was not always microscopically constant. As a remedy to this problem they used a Group IB-IIIA oxide composition, which has a high melting temperature, instead of the element layers. They concluded that the Group IB-IIIA oxide composition did not melt from the heat treatment temperature under a reducing atmosphere containing the Group VIA element or containing the reducing compound of the Group VIA element, and that the initial composition can be maintained in micro-scale. X-ray diffraction data indicated the formation of the Group IB-IIIA-VIA phase. However, apparently no data has been published on the electronic qualities of these layers, and no active devices such as solar cells have been fabricated.

Another approach concerning the micro-scale control of the I/III ratio is indicated in European Patent No. 93116575.7 (Publication No. 0595115A1, 1994) of T. Wada et al. There, a chalcopyrite-type compound is prepared by annealing a thin film containing Cu, In and an In compound or a compound which contains both In and Cu, selected from the group consisting of oxides, sulfides and selenides, in an atmosphere containing a Group VIA element. It is concluded that since a Cu/In ratio of less than about 1.0 is desired for a solar cell grade $CuInSe_2$ compound film, excess Group IIIA element In had to be present prior to annealing. According to these researchers In would give rise to microscopic non-uniformities in the layers because of its low melting point. Therefore, the idea was to replace In with its high melting point oxide, sulfide or selenide. This was achieved by depositing multi-layers onto substrates, just as in two-stage processes, and by their reaction to form the desired compounds. Some of the examples of multi-layer depositions include electron-beam evaporation or sputtering of a Cu layer and an In layer, followed by sputtering or laser ablation of an indium oxide, indium sulfide or indium selenide, co-deposition of a $Cu_{11}In_9$ alloy layer followed by the deposition of a film of an oxide, selenide or sulfide of In, deposition of a Cu layer and an In layer, followed by the deposition of an indium oxide and then a copper oxide layer, or an indium selenide and a copper selenide layer, or an indium sulfide and a copper indium sulfide layer.

A processing technique employing multi-layers of deposited materials containing the Group IB and IIIA elements may address the issue of micro-scale compositional uniformity by including high melting point compounds in the layers, however, just as in simpler two-stage processes, would not be expected to address the more important issue of macro-scale uniformity of the I/III ratio. In other words, if multi layers containing Group IB and IIIA elements need to be deposited on a large area substrate, the thickness and the thickness uniformity of each layer containing the Group IB and/or IIIA elements requires strict control. In that respect, compositional control for, e.g., $Cu/In/In_2O_3$ or a $Cu/In/Cu_2O_5$ stack, for example, is more complicated than for the Cu/In stack of the simple two-stage process.

As the above review of prior art demonstrates, there is a need for techniques to provide Group IB-IIIA-VIA (and related) compound films on large area substrates, with good compositional uniformity. There is also a need for such compound films with superior electronic properties, that would make them suitable for the fabrication of active electronic devices such as solar cells.

SUMMARY OF THE INVENTION

In accordance with the invention, a method of forming a compound film includes the steps of preparing a source material, depositing the source material on a base to form a precursor film, and heating the precursor film in a suitable atmosphere to form a film. The source material includes Group IB-IIIA alloy-containing particles having at least one Group IB-IIIA alloy phase, with Group IB-IIIA alloys constituting greater than about 50 molar percent of the Group IB elements and greater than about 50 molar percent of the Group IIIA elements in the source material. The film, then, includes a Group IB-IIIA-VIA compound. The molar ratio of Group IB to Group IIIA elements in the source material may be greater than about 0.80 and less than about 1.0, or substantially greater than 1.0, in which case this ratio in the compound film may be reduced to greater than about 0.80 and less than about 1.0. The source material may be prepared as an ink from particles in powder form. The alloy phase may include a dopant. Compound films including a Group IIB-IVA-VA compound or a Group IB-VA-VIA compound may be substituted using appropriate substitutions in the method. The method, also, is applicable to fabrication of solar cells and other electronic devices.

The foregoing and additional features and advantages of this invention will become further apparent from the detailed description and accompanying drawing figures that follow. In the figures and written description, numerals indicate the various features of the invention, like numerals referring to like features, throughout for the drawing figures and the written description.

DETAILED DESCRIPTION

Figure 1:
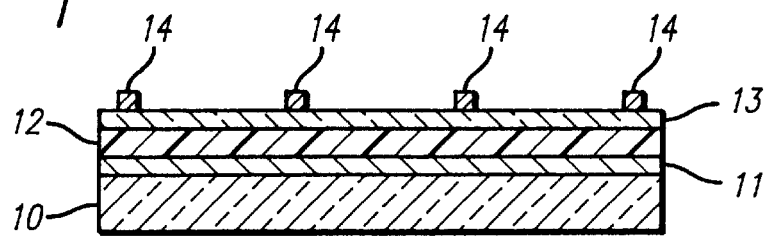
FIG. 1 is a cross-sectional view of a solar cell, made in accordance with the present invention.

The typical general structure of a conventional Group IB-IIIA-VIA compound solar cell, as well as one made in accordance with the present invention, is shown in FIG. 1. The device is fabricated on a substrate that includes a sub-layer 10, such as of a glass material. P-type absorber film 12 is deposited over a conductive layer 11, e.g. made of molybdenum (Mo), which acts as the back ohmic contact to the solar cell, and which is a coating for the sub-layer of the substrate. The sub-layer 10 and its coating 11 may together be regarded as the substrate.

An n-type transparent window layer 13 is formed on the p-type absorber film 12, through which radiation enters the device. The solar cell is completed by depositing metallic grid finger patterns 14 over the window layer 13, if needed. The most commonly used p-type absorber films 12 are Group IB-IIIA-VIA absorber films 12, with compositions that can be represented by the general chemical formula of $CuIn_{1-x}Ga_xSe_{2(1-y)}S_{2y}$, where $0 \leq x \leq 1$ and $0 \leq y \leq 1$. This group of compounds is also represented by the general chemical formula of $Cu(In,Ga)(Se,S)_2$.

Constituent elements of the representative specific compounds mentioned in this document are grouped according to the notations of columns of the periodic table defined by Chemical Abstracts Service (CAS), as shown in the CRC Handbook of Chemistry & Physics, 72nd edition, 1991–1992, published by CRC Press, Inc., e.g., the inside cover table.

A variety of materials, deposited by a variety of methods, can be used to provide the components of the device depicted in FIG. 1. For example, the substrate sub-layer 10 can be rigid or flexible, conductive or insulating. Possible sub-layer 10 materials include, but are not limited to, sheets or flexible foils of insulating sub-layers, such as glass, alumina, mica or polyimide materials, or conductive materials, such as Mo, tungsten (W), tantalum (Ta), titanium (Ti), aluminum (Al), nickel (Ni) and stainless steel.

The conductive layer or coating 11 is made of a conductive material that provides good ohmic contact to the Group IB-IIIA-VIA semiconductor absorber film 12, like Mo, which is a preferred material, W, Ta, Ti, gold (Au), and nitrides or phosphides or tellurides. The conductive layer 11, in fact, may consist of two or more layers of materials. The conductive layer 11 is not needed if the sub-layer 10 is a conductive material, that would provide good ohmic contact to the semiconductor absorber film 12.

The material of the Group IB-IIIA-VIA semiconductor absorber film 12, that can be deposited using the teachings of this invention, is selected from the group consisting of ternary or higher order selenides, sulfides and tellurides of copper (Cu), silver (Ag), aluminum (Al), gallium (Ga), indium (In), thallium (Tl) and their alloys. The preferred material for the layer of the absorber film 12 is $CuIn_{1-x}Ga_xSe_{2(1-y)}S_{2y}$, where $0 \leq x \leq 1$ and $0 \leq y \leq 1$. This layer may additionally contain dopants such as potassium (K), sodium (Na), lithium (Li), phosphorous (P), arsenic (As), antimony (Sb) and bismuth (Bi) to enhance its electronic properties.

The window layer 13 has one or more layers of transparent semiconductor materials commonly used in solar cells, like cadmium (Cd), zinc (Zn) and sulfur (S) or selenium (Se) compounds such as Cd(Zn)S and ZnSe, or transparent conductive oxides such as ZnO, indium tin oxide, and tin oxide. Various layers may also be paired, to optimize device performance. Possible structures of optimized window materials include, but are not limited to, Cd(Zn)S/TCO, ZnSe/TCO, In(Ga)-selenide/TCO, In(Ga)-sulfide/TCO, and In(Ga)-oxide/TCO, where TCO represents one or more layers of Transparent Conductive Oxides such as ZnO, indium tin oxide, and tin oxide. The window layer 13 materials can be deposited by various techniques well known in the art. As is conventionally understood notations such as "Cd(Zn)S" and "In(Ga)" mean all compositions going from pure CdS to pure ZnS and all compositions going from pure In to pure Ga.

The finger pattern 14 may be deposited on the device structure to reduce the series resistance introduced by the window layer 13. In module structures employing narrow solar cells there is no need for finger patterns 14. An anti-reflection coating (not shown) can also be deposited over the window layer 13 to further improve the efficiency of the finished solar cells.

The preferred electrical type of the Group IB-IIIA-VIA absorber film 12 of FIG. 1 is p-type, and the preferred type of the window layer 13 is n-type. However, an n-type absorber and a p-type window layer can also be utilized. The preferred device structure of FIG. 1 is commonly referred to as a "substrate-type" structure. A "superstrate-type" structure can also be constructed by depositing a window layer first on a transparent sheet substrate, such as one made of a glass material, then depositing the Group IB-IIIA-VIA compound absorber film, and finally forming a back ohmic contact to the device by a conductive layer. In this superstrate structure, solar energy or light enters the device from the superstrate side which faces the solar energy or light.

Figure 2:
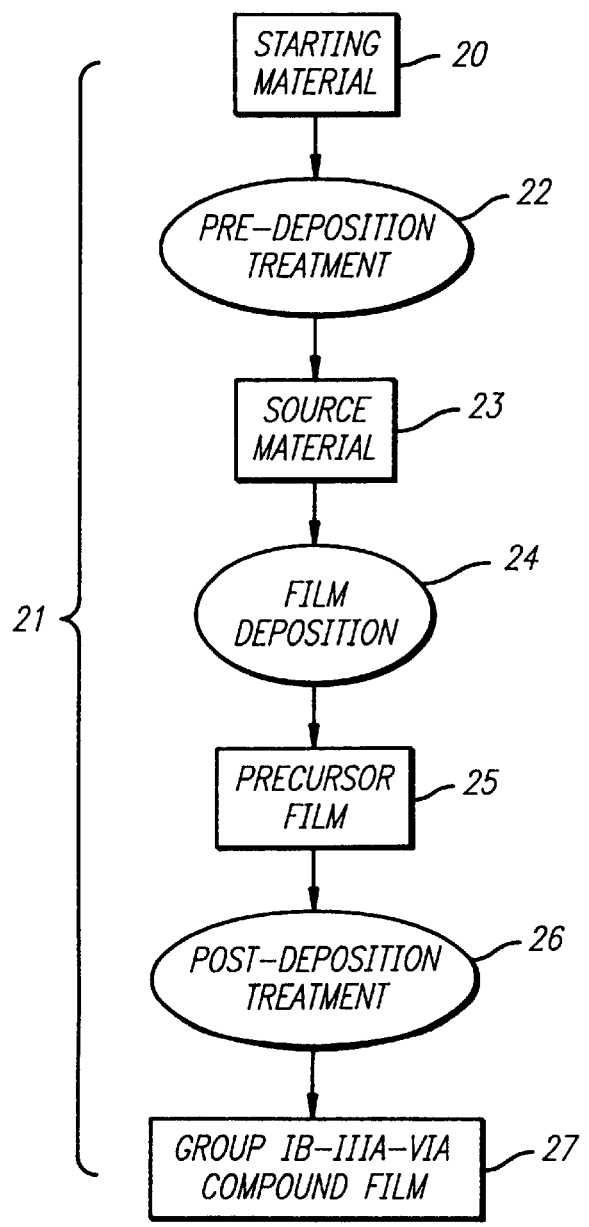
FIG. 2 is a flow chart showing the steps of a method used to grow Group IB-IIIA-VIA compound thin films, in accordance with the present invention.

FIG. 2 shows the general steps of a process 21 for deposition of Group IB-IIIA-VIA compound films 27, where the desired I/III ratio is fixed in a source material 23 before film deposition, and this fixed composition is transferred into a precursor film 25, used to form the Group IB-IIIA-VIA compound film 27. The starting material 20 is the initial material employed in a pre-deposition treatment step 22, which treats the starting material 20 in a way to render it suitable for deposition onto a selected substrate in the form of a precursor film 25. The result of the pre-deposition treatment step 22 is the source material 23 which can be transferred onto the substrate in the form of the precursor film 25, through the film deposition step 24. A post-deposition treatment step 26 of the precursor film 25 forms the final Group IB-IIIA-VIA compound film 27.

Figure 3:
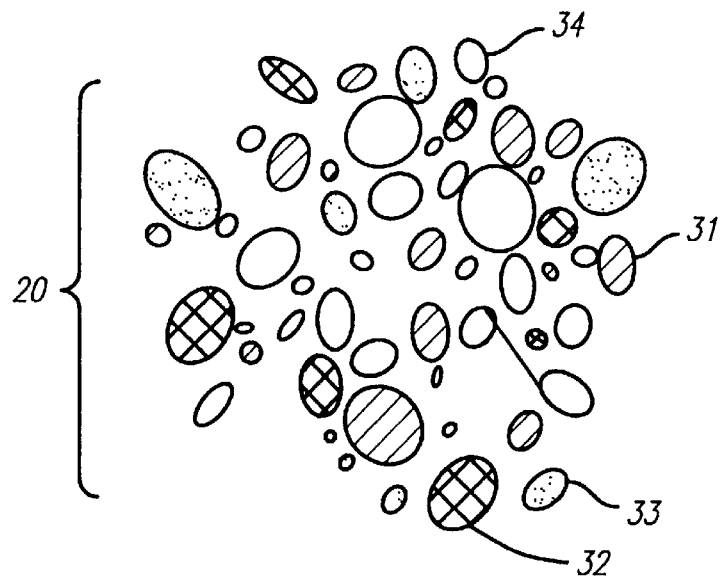
FIG. 3 is a schematic drawing showing the composition of the starting material, in accordance with the present invention.

With reference to FIG. 2, a preferred form of the starting material 20 of the present invention is powder. The composition of this powder is schematically shown in FIG. 3. In FIG. 3, the starting material 20 includes the Group IB-IIIA alloy-containing particles 31, Group IB element particles 32, Group IIIA element particles 33, and Group VIA element particles 34. The Group IB-IIIA alloy-containing particles 31 may, in addition to the Group IB-IIIA alloy phases, contain Group IIIA element phases such as In and/or Ga. The Group IB-IIIA alloy phases that may be contained in particles 31 include, but are not limited to, $Cu_4In$, $Cu_2In$, $Cu_{11}In_9$, $Cu_{16}In_9$, $CuIn_2$, $Cu_9In_4$, $Cu_7In_3$, $CuIn$, $Cu_7In_4$, $CuGa_2$, $Cu_9Ga_4$ and alloys thereof. The exact phase content of the particles 31 depends on the method of preparation and the targeted I/III ratio. For example, particles 31 that are obtained by techniques which involve rapid cooling of melted Group IB-IIIA compositions are likely to contain Group IB-IIIA alloy phases that exist at high temperatures. When such powders are later annealed at lower temperatures, their content may change to phases that are more stable at lower temperatures. Also more generally, the Group IB and/or Group IIIA element particles 32 and 33 may not be present.

It is important that the I/III ratio in the Group IB-IIIA alloy-containing particles 31 is fixed and known beforehand, and that the overall I/III ratio of the starting material 20 powder is fixed and known. For example, if the Group IB element is Cu and the Group IIIA element is In, and the starting material 20 is a mixture of a Cu—In alloy-containing powder, Cu powder and In powder, then it is preferred that $Cu_{31}/(Cu_{31}+Cu_{32})>0.9$ and $In_{31}/(In_{31}+In_{33})>0.9$, where $Cu_{31}$ is the Cu molar content of the Cu—In alloy-containing particles 31, $Cu_{32}$ is the molar Cu content of the Cu particles 32, $In_{31}$ is the In molar content of the Cu—In alloy-containing particles 31, and $In_{33}$ is the In content of the particles 33.

With reference to FIG. 3, the preferred Group IB element is Cu and the preferred Group IIIA elements are In and Ga. The preferred Group VIA element is at least one selected from the group of Se, S and Te. The particles 31, 32, 33, 34 can be irregular in shape or they can be round. The powders can be obtained by various methods known to those skilled in the art of powder metallurgy. These techniques include, but are not limited to, mechanical grinding of a bulk material, atomization or spinning of a melt, hydro-metallurgical techniques, electrolytic techniques, precipitation methods and spray pyrolysis. Recently developed spark erosion approaches and chemical techniques used for nano-particle generation are also applicable to the preparation of the powders used in the present invention.

Figure 4A:
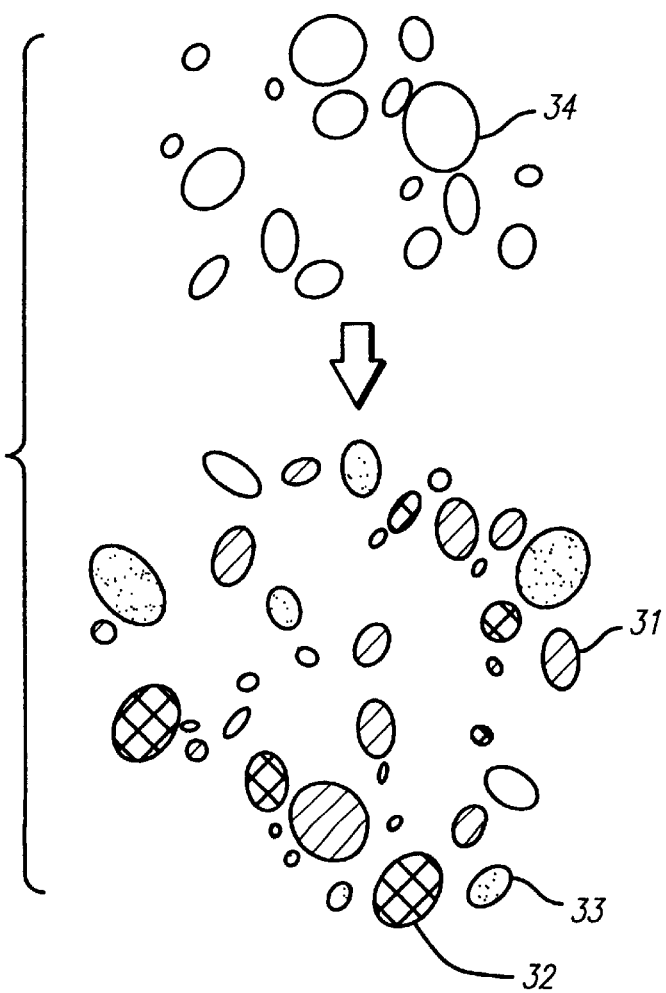
FIG. 4A diagrammatically shows Group VIA particles in powder form being mixed with a powder that includes Group IB-IIIA alloy-containing particles.

FIGS. 4A through 4F diagrammatically illustrates a process in accordance with the invention and FIG. 2. FIG. 4A diagrammatically shows Group VIA particles 34 in powder form being mixed with the other particles of FIG. 3, including the Group IB-IIIA alloy-containing particles 31 to form the starting material of FIG. 3, represented at 20 in FIG. 2.

Figure 4B:
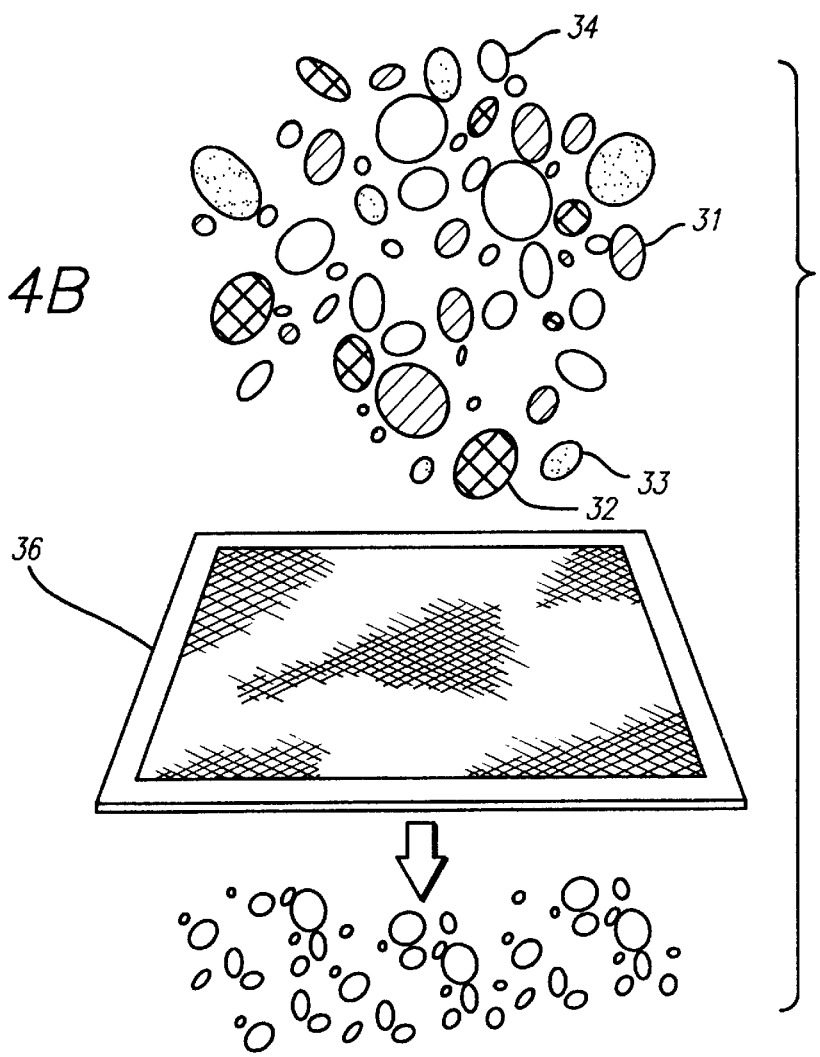
FIG. 4B diagrammatically shows the elimination of particles larger than a predetermined size from the mixed powder of FIG. 4A.

FIG. 4B diagrammatically shows the elimination of particles larger than a predetermined size from the mixed powder of FIG. 4A. This elimination is diagrammatically represented by passing the starting material through a screen 36. And this elimination is pre-deposition treatment represented in FIG. 2 at 22.

Figure 4C:
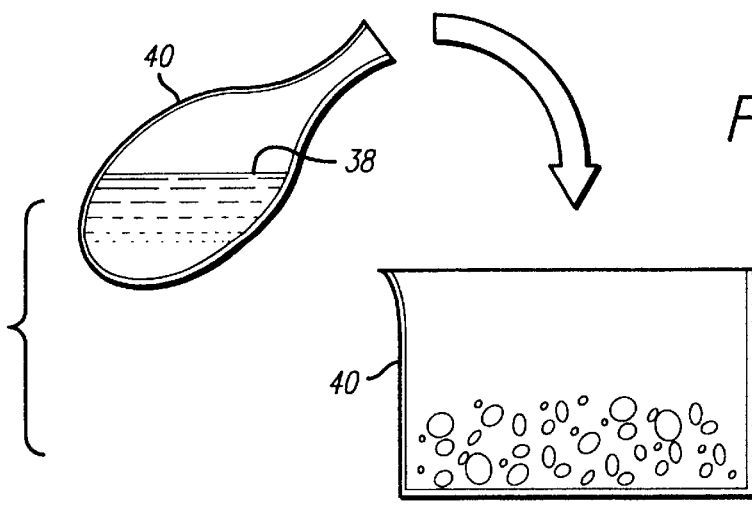
FIG. 4C diagrammatically illustrates the powder with only the smaller particles being mixed with a liquid as a step to form an ink.

FIG. 4C diagrammatically illustrates the powder with only the smaller particles being mixed with a liquid as a step to form an ink. This is diagrammatically represented by pouring the liquid 38 from a flask 40 into a beaker 40 containing the powder. This is part of the pre-deposition treatment, represented in FIG. 2 at 22.

Figure 4D:
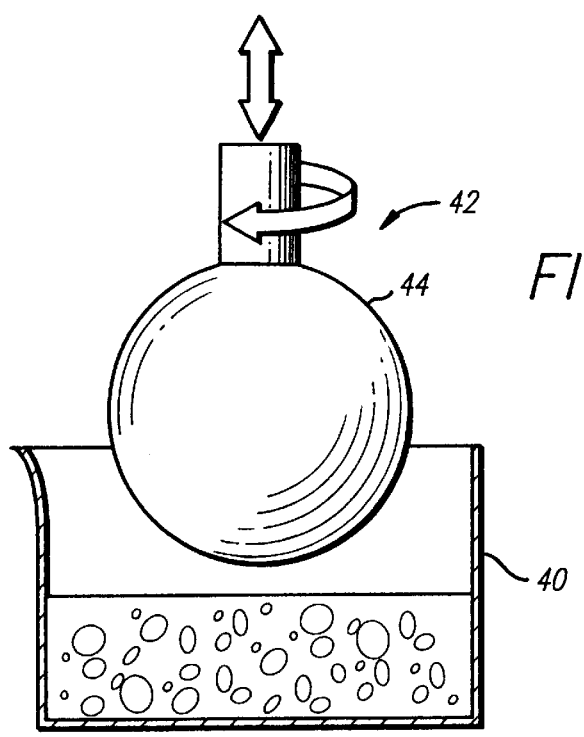
FIG. 4D diagrammatically illustrates the powdercontaining liquid being subjected to milling to form an ink.

FIG. 4D diagrammatically illustrates the powder-containing liquid subjected to milling for ink formation. This is also part of the pre-deposition treatment, represented in FIG. 2 at 22 to decrease the particle size, even beyond the levels in starting material 20. Simply for diagrammatic purposes, it is represented as accomplished through a grinding structure 42, including a ball portion 44 that can be lowered into the ink in the beaker 40 and revolve, thus breaking up the powder particles in the ink. In practice, the typical ball milling procedure uses a ceramic milling jar filled with grinding ceramic balls. When the jar is rotated or shaken, the balls shake and grind the powder in the liquid medium to create the ink with small particles.

Figure 4E:
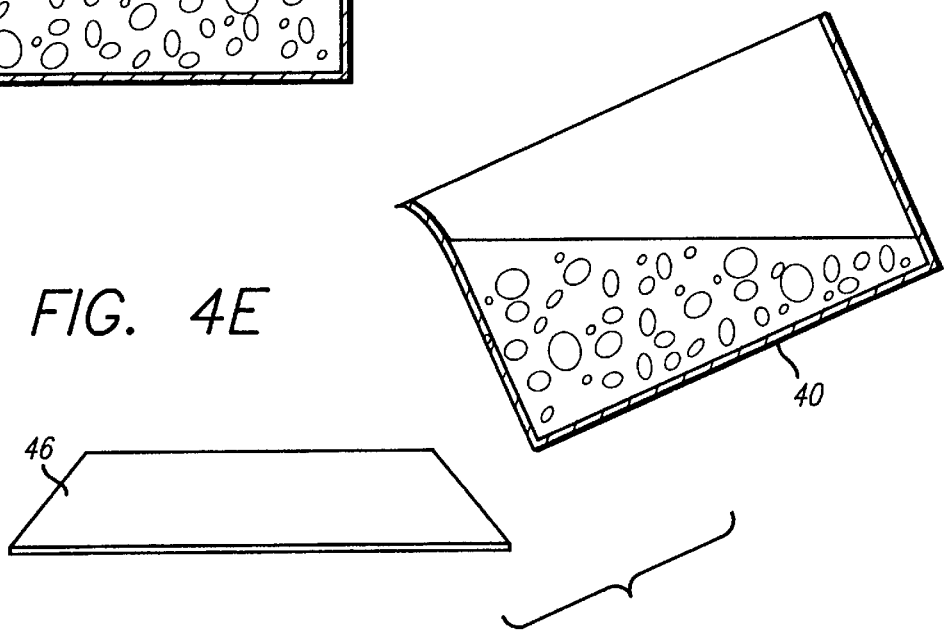
FIG. 4E diagrammatically illustrates the milled ink being deposited on a large substrate.

FIG. 4E diagrammatically illustrates the milled ink being deposited on a large substrate 46. This, of course, illustrates the film deposition, represented in FIG. 2 at 24, and results in the precursor film, represented at 25 in FIG. 2, on the substrate.

Figure 4F:
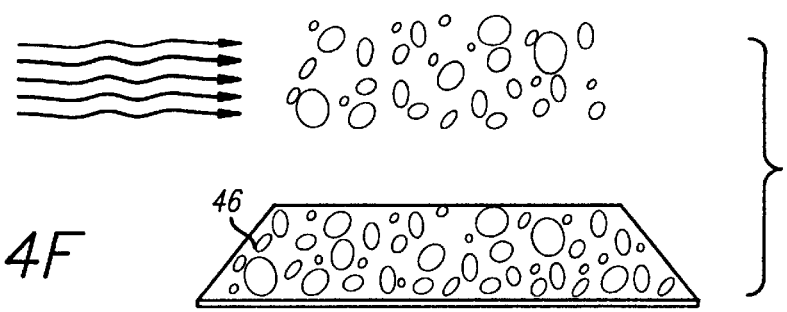
FIG. 4F diagrammatically illustrates the substrate with the deposited ink being subjected to an atmosphere containing Group VIA elements and heated to form the Group IB-IIIA-VIA compound film on the substrate.

FIG. 4F diagrammatically illustrates the substrate with the precursor film on it, being subject to an atmosphere containing Group VIA elements (in vapor form) accompanied by the application of heat to form the Group IB-IIIA-VIA compound film on the substrate, such compound film represented at 27 in FIG. 2.

Referring back to FIGS. 2 and 4D, the pre-deposition treatment step 22, as described, involves milling. Milling can be carried out in liquid media such as water, alcohols and other organic liquids, or it can be carried out dry. Milling can be carried out at room temperature or at lower temperatures. The purpose of the milling step is to reduce the size of the particles in the source material. This is important for micro-scale uniformity of the films to be grown. The particle sizes generally should be smaller than the thickness of the film to be grown, most typically, less that or equal to 2.0 $\mu$m. This may be determined by standard techniques which are used to assure that substantially all of the particles in a group are less than or equal to a certain size, such as conventional light scattering analysis. It is preferable that such techniques show that less than 1% of the particles exceed this size, although less than 5% may be acceptable. This size may typically be considered as the longest straight line that could be drawn between two points on the surface of the particle. Source material 23 that is obtained as a result of the pre-deposition treatment step 22 may typically be in the form of a paste, an ink, a solution, a dispersion or a dry powder.

If the particle sizes in the starting material powder 20 or such powder, e.g., after sieving, meets the size requirement, the milling process may not be needed. For example, in some techniques such as spark erosion, fine powders containing the Group IB-IIIA alloys may be formed in a dielectric liquid such as water, or in a cryogenic, alcohol or hydrocarbon liquid. It is also possible to mill the various components of the starting material 20 separately, and then mix the milled components to form a starting material. For example, for a starting material having only the Group IB-IIIA alloy-containing particles 31 and Group VIA element particles 34, a powder of each of the two particle types may be prepared and milled separately. After milling the two powders, they may be mixed to form a starting material.

Source material 23 may additionally contain electrical dopants. These dopants may originate from the starting material, for example, may be present as one or more separate type of particle components of a mix similar to that in FIG. 3, or mixed in as additional constituents of other particle components, including as constituents of a Group IB-IIIA alloy. Thus, of course, as one method, they can be included in the form of additional elemental powders or additional powders including dopant compounds, or even in a liquid. As indicated in the examples, such dopants may also be included in the Group IB-IIIA-VIA compound film at other points of the process. Group IA and/or Group VA elements typically may serve as such dopants.

Referring to FIG. 2, the precursor film 25 is obtained by depositing the source material 23 on the substrate, which may be a two-layer substrate consisting of a sub-layer and a coating layer, in the form of a film through the film deposition step 24. Various techniques can be used for the film deposition step 24. For source materials 23 that are in the form of pastes, screen printing techniques can be employed. If the source material 23 is in the form of an ink or paint, many wet deposition techniques known to those skilled in the art can be used, like painting by spray, brush, roller or pad, gravure printing, stamp printing, knife coating, cup coating and curtain coating. If the source material 23 is in the form of dry powder it can be coated on the substrate using dry powder coating methods such as spraying, including electrostatic spraying. For electrostatic deposition methods dry powder particles may have to be first coated with a dielectric layer to be able to electrically charge them. The precursor film 25 should have a thickness of greater than or equal to 0.5 $\mu$m and less than or equal to 20 $\mu$m, and the preferred thickness range is greater than or equal to 1.0 $\mu$m and less than or equal to 10 $\mu$m.

As indicated, assuming the separate Group IB 32 and Group IIIA 33 particles are present, it is still preferable that, e.g., at least 50 molar % of the Group IB elements and at least 50 molar % of the Group IIIA elements of the source material 23 are contained in one or more Group IB-IIIA alloys in the small (e.g., smaller than or equal to 2 μm) Group IB-IIIA alloy-containing particles, which are distributed throughout the source material 23. This facilitates the control and uniformity of distribution of the I/III ratio in the final compound film 27 irrespective of the size of the substrate or the thickness uniformity of the precursor film 25 or compound film 27. Generally, even higher molar percentages, such as at least 60% in each case, at least 90% in each case, or 100% is advantageous, purely from the perspective of controlling this ratio and its uniformity of distribution. Of course, this may involve the complete absence of the separate Group IB and Group IIIA particles.

Still referring to FIG. 2, after its deposition, the precursor film 25 is subjected to the post-deposition treatment step 26 to form the Group IB-IIIA-VIA compound film 27. The post-deposition treatment step 26 includes heat treatment, which may be in the form of furnace annealing at atmospheric pressure, annealing in vacuum, rapid thermal annealing or laser annealing. The atmosphere during the annealing step can be inert, such as vacuum, argon (Ar), helium (He) or nitrogen (N) (e.g., as $N_2$), it may include reducing gas such as hydrogen (H) (e.g., as $H_2$), and it may contain Group VIA elements such as Se, S and Te. The exact nature of the annealing atmosphere of the post-deposition treatment step 26 depends on the nature of the source material 23. For example, if the source material 23 contains an adequate amount of the Group VIA elements, the annealing atmosphere used can be inert or reducing. If, on the other hand, the source material 23 does not contain any Group VIA element or it does not contain an adequate amount, then the annealing atmosphere should contain the desired Group VIA elements to be able to form the good quality Group IB-IIIA-VIA compound film 27.

In the case of selenide growth, the annealing atmosphere may contain $H_2Se$, $(CH_3)_2Se$, $(C_2H_5)_2Se$ or Se vapor. In the case of sulfide growth, $H_2S$, $CS_2$ or S vapors can be used. For sulfo-selenide layers, a mixture of S and Se containing species in the annealing atmosphere can be used, or one type of the Group VIA element such as Se, may be included in the precursor film 25, and the other one, such as S, can be supplied from the annealing atmosphere during the post-deposition treatment step 26. The temperature of annealing can be in the range of 350° C. to 700° C., with the range of 400° C. to 600° C. typically preferred. The duration of annealing depends on the temperature of annealing, and it may vary from about 5 minutes to about 3 hours, with about 15 minutes to about 1 hour typically preferred, when the furnace annealing is employed.

In one preferred embodiment of the present invention the I/III molar ratio of the source material 23 is greater than or equal to 0.80 and less than or equal to 1.0, and this ratio is substantially carried to the precursor film 25 in a uniform manner. Referring to FIG. 2, in this case, the I/III molar ratio of the Group IB-IIIA-VIA compound film 27 is very close to the I/III ratio of the source material 23. Alternatively, a source material 23 with a I/III ratio of higher than 1.0 and up to about 1.2 can be prepared, for example using $Cu_{11}In_9$, and a precursor film 25 with the same ratio can be deposited. During the post-deposition treatment step 26, additional Group IIIA materials can be added to the compound film 27, bringing its overall I/III ratio to the desired range less than or equal to 1.0 (while greater than or equal to 0.80). Such an approach is practical if the precursor film 25 layer contains at least about 80% of the Group IB elements, and at least about 80% of the Group IIIA elements required for the formation of the Group IB-IIIA-VIA compound film 27. Otherwise, very uniform delivery of the additional Group IIIA elements onto the precursor film 25 would be required.

EXAMPLE 1

A first example of the present invention used a Cu—In alloy starting material 20 powder obtained by the melt atomization technique. The starting material 20 was obtained by mixing and melting 33.25 weight percent of pure Cu, and 66.75 weight percent of pure In, under a hydrogen curtain at above 900° C. This Cu/In ratio of the melt corresponded to a molar ratio of 0.9. The melted alloy was transformed into powder form in a gas atomizer employing Ar gas. Quenched powder fell into distilled water on the bottom of the reactor for further cooling. The powder starting material 20 was sieved, using −625 mesh screen. A particle size analysis, by conventional optical scattering evaluation, showed that, after sieving, the powder substantially consisted of particles with sizes ranging from 1.3 μm to 20 μm with less that 0.3% greater than 20 μm. X-ray diffraction analysis indicated presence of Cu—In alloy phases such as $Cu_2In$, $Cu_{16}In_9$, and possibly $Cu_{11}In_9$. In addition to the alloy phases, there was a distinct phase of In in this starting material 20. The starting material 20 of this example had no Group IB element particles 32, no Group IIIA element particles 33 and no Group VIA element particles 34. The starting material 20 only contained the Group IB-IIIA alloy-containing particles 31 which, in addition to the Group IB-IIIA alloys, contained elemental phase of In. The selected Cu/In ratio was 0.9. Specifically this molar ratio based on the initial weight percentages can generally be assumed to be carried through into the powder which is in the ink. The analogous assumption typically applies where this ratio, for example, is greater than about 0.80 and less than about 1.0, and is applied in these examples.

The source material 23 was then made by using the following pre-deposition treatments. 9.76 grams of the sieved powder was mixed with 22.62 grams of water. To the mixture, 0.14 grams of wetting agent (W-22 manufactured by Daniel Products of New Jersey) and 0.39 grams of dispersant (D-3019 manufactured by Rohm & Haas of Pennsylvania) was added. The mixture was milled in a ball mill for 42 hours. The resulting source material 23 was in the form of a water-thin ink.

Figure 5:
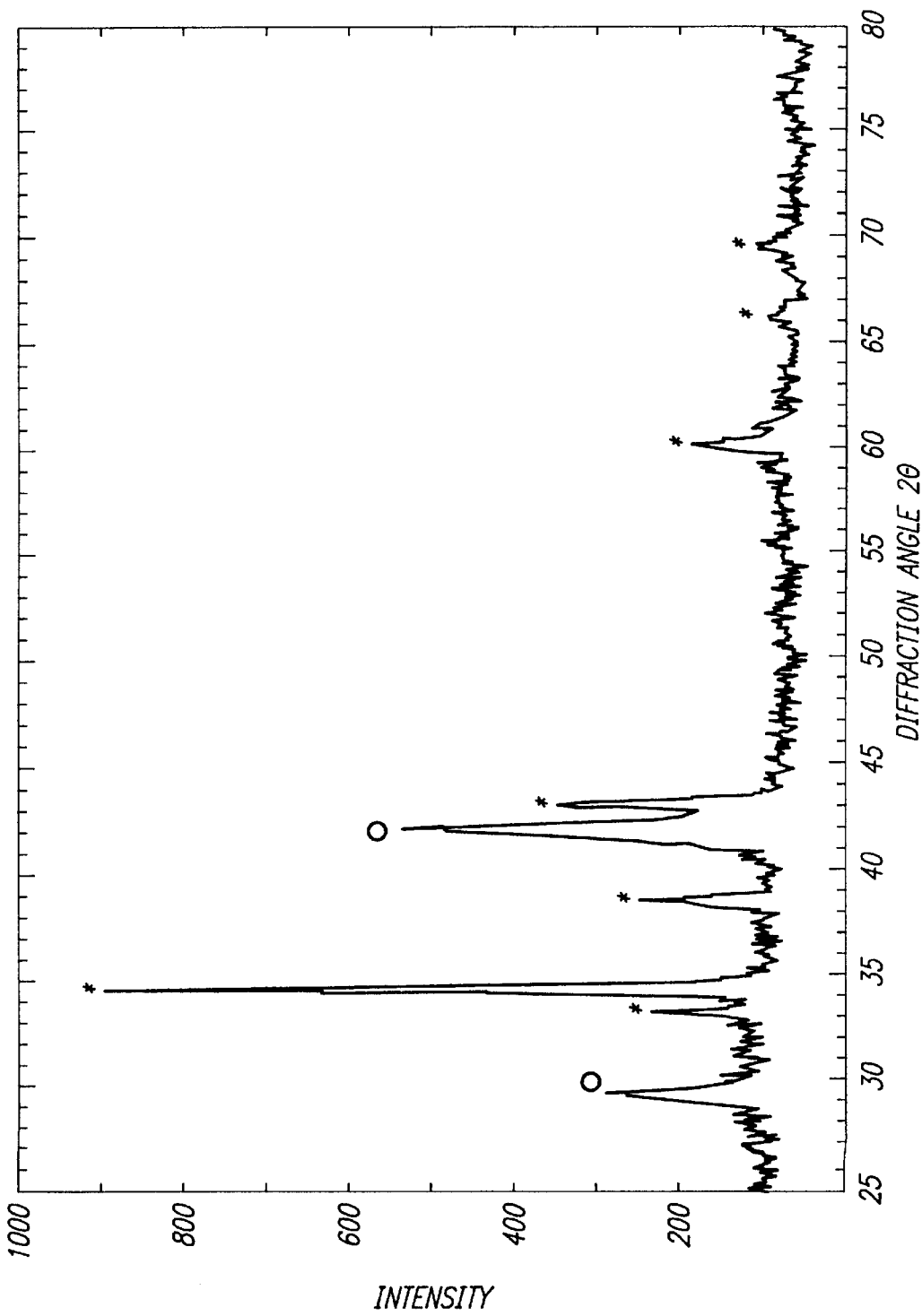
FIG. 5 illustrates the X-ray diffraction data obtained from a precursor film, prepared in accordance with the present invention.

For test purposes, a precursor film of this ink (thus, having no Group VIA present) was coated by the cup-coating technique on a conventional piece of off-the-shelf soda-lime glass. Such glass typically contains about 15 to 17 percent sodium oxide (by weight). The cup used had an opening with a depth of 6 mils (150 μm), and the resulting layer, after drying on a hot plate at 60° C., was about 20 μm thick. X-ray diffraction analysis, presented in FIG. 5, shows the X-ray diffraction spectra which indicate the presence of $CuIn_2$ phase, marked with asterisks, and $Cu_{11}In_9$ phase, marked with dots. Particle size analysis, by conventional optical scattering evaluation, made on the ink showed the largest particle size (largest dimension across) to be about 2.0 μm, and a mean particle size of about 0.5 μm.

The above results demonstrated efficient particle milling even with the presence of a soft material such as In. The approach described, as demonstrated in this example, chemically ties much of the Group IIIA element (In) of the formulation to the Group IB element (Cu), in the form of a Cu—In alloy. Any excess In is dispersed microscopically throughout the small particles. The particles that contain the Cu—In alloy phases and microscopically distributed In phase can be efficiently milled, as demonstrated in this example. This is probably due to the fact that Cu—In alloys are much more brittle than In. The X-ray diffraction data also indicate that during the milling process the microscopically distributed In further reacts with the Cu—In phases, and forms an In-rich alloy phase which was determined to be CuIn$_2$. No appreciable amount of In$_2$O$_3$ phase in the milled powder was observed, despite the fact that the milling was done in water. This may be due to the fact that most of the In in this invention is chemically tied in Cu—In alloys, and oxidation of In in the alloy is not favored as much as oxidation of pure In element.

Figure 6:
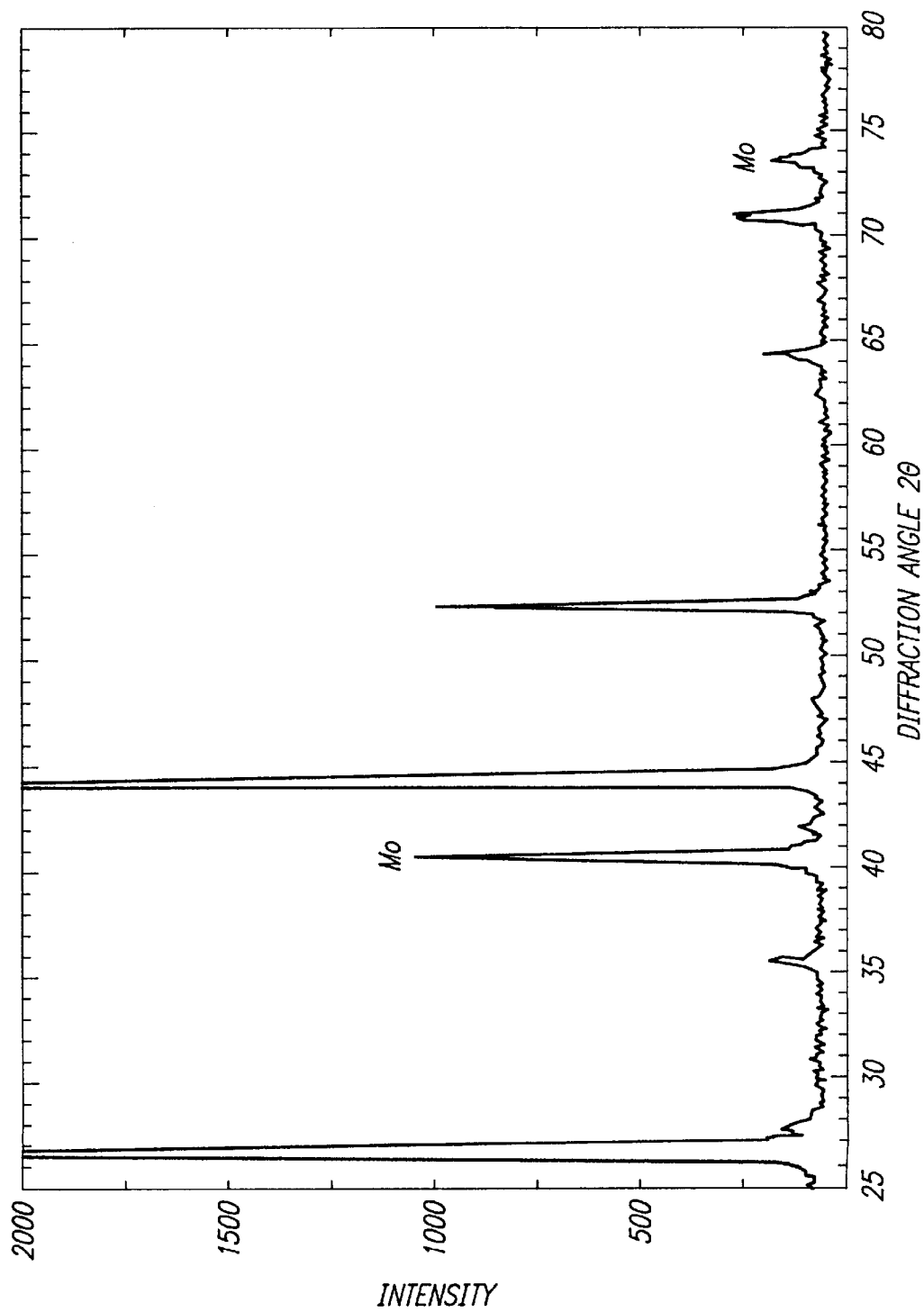
FIG. 6 illustrates X-ray diffraction data obtained from a $CuInSe_2$ film, prepared in accordance with the present invention.

Once the species in the above-described precursor film was identified by the X-ray diffraction results of FIG. 5, a thinner film was coated by the cup-coating method on a two-layer substrate made of a glass sub-layer and Mo coating layer (such as is shown at 10 and 11 and in FIG. 3) using the same ink described above. This method also uses a conventional piece of off-the-shelf soda-lime glass as the sub-layer. As a result, the precursor film 25 was about 4 μm thick and it was put into a selenization reactor and annealed at about 450° C. in a 5% H$_2$Se and 95% N$_2$ gas mixture for 15 minutes. After cooling down, the compound film obtained by this method was taken out of the reactor and X-ray diffraction analysis was done. Obtained diffraction data are illustrated in FIG. 6. All the peaks of FIG. 6 are associated with copper-indium-diselenide CuInSe$_2$, except the two associated with the Mo-coating of the substrate, which are labeled Mo. This demonstrated the ability of the present invention to yield the Group IB-IIIA-VIA compound. In addition, the substrates made of soda-lime glass with Na provide Na, which acts as a naturally-provided dopant for CuInSe$_2$, and as a result, assuming doping is desired, no additional doping is needed. The idea of doping assumes the presence of only a small percentage of dopant in the doped material, typically each dopant added being less than about 1 molar % of the atoms for which they may be substitutes in a material or formulation. In reality, only a small fraction of this 1 molar % usually becomes electronically active as a dopant in the material—typically less than about 1% of this 1%. Thus, for example, if a dopant is present in the starting material or source material, as part of a Group IB/IIIA alloy phase, that phase is viewed as a doped Group IB-IIIA alloy phase, with the dopant a small percentage constituent.

EXAMPLE 2

In another example, the starting material 20 powder of the first example was used in a mixture of 9.78 grams of the sieved powder with 22.4 grams of water, 0.14 grams of W-22, 0.39 grams of D-3019 and 0.1 gram of Se powder. The mixture was milled in a ball mill for 42 hours. The resulting source material 23 was in the form of a water-thin ink. The precursor film 25 obtained by this method was deposited by the same cup-coating technique as in the first example on the same form of the two-layer glass/Mo substrate using the ink source material 23. The resulting precursor film 25 was about 4 μm thick. The resulting precursor film 25 was put in a selenization reactor and annealed at about 450° C. in a 5% H$_2$Se and 95% N$_2$ gas mixture for 15 minutes. X-ray diffraction data of the resulting layer identified the compound film 27 as CuInSe$_2$. This example was repeated by increasing the Se amount to 3.04 grams, reducing the water to 22 grams and reducing the starting material powder to 6.61 grams. Formation of CuInSe$_2$ was confirmed by X-ray diffraction data. However, this film was more porous compared to the one prepared with only 0.1 grams of Se.

EXAMPLE 3

In a third example, the melt atomization technique of the first example was used to obtain another starting material 20 powder, followed by a sieving step, with a different composition of 50.78 weight percent of In, 36 weight percent of Cu and 13.22 weight percent of Ga. This composition corresponds to the molar ratios of Cu/(In+Ga)=0.9 and Ga/(Ga+In)=0.3. Here, the Group IB element was Cu and the Group IIIA was an alloy or mixture of In and Ga that can be represented by the chemical formula In$_x$ Ga$_{(1-x)}$ with 0<x<1. In this example, 11.03 grams of the resulting starting material 20 powder was milled in a ball mill in a mixture with 25.03 grams of water along with 0.16 grams of W-22, 0.44 grams of D-3019 and 0.11 grams of Se powder for 42 hours. The ink source material 23 obtained as a result of the milling process had some agglomerated particles, which were broken down by a mortar and pestle. The ink was painted on a soda-lime glass substrate (using the same off-the-shelf soda-lime glass material containing Na as in the first example), using a brush. The selenization step of Example 1 was carried out on the resulting layer. X-ray diffraction data showed the peaks associated with CuInSe$_2$ and CuIn$_{0.7}$Ga$_{0.3}$Se$_2$ phases.

EXAMPLE 4

Figure 7:
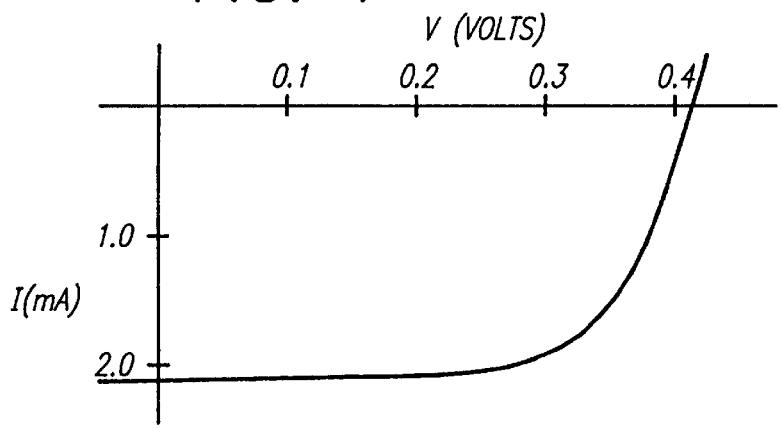
FIG. 7 illustrates illuminated I–V characteristics of a solar cell, fabricated on a $CuInSe_2$ film grown in accordance with the present invention.

In yet another example, a piece of the CuInSe$_2$ film formed on a glass/Mo substrate in accordance with the first example was used for fabrication of a CuInSe$_2$/CdZnS solar cell device, using standard procedures known in the art. A thin layer of CdZnS was deposited on the CuInSe$_2$ by a commonly used chemical bath deposition technique. The deposition bath consisted of 5 ml of 0.5 molar zinc acetate, 10 ml of 1.0 molar cadmium acetate, 7 ml of triethanolamine, 4.5 ml of ammonium hydroxide and 55 ml of distilled water. The solution was heated to 55° C. and the sample was placed in a beaker containing the solution. Twelve ml of 1.0 molar thiorea was added into the beaker, initiating the CdZnS deposition which lasted 10 minutes. Since the CuInSe$_2$ film was dipped in the bath, this deposition resulted in an extra layer of CdZnS deposited at the back of the CuInSe$_2$ film, which was removed using a cotton swab dipped in HCL. The CdZnS deposition was followed by the deposition of a transparent ZnO layer by the commonly used metal organic chemical vapor deposition (MOCVD) technique, employing diethyl zinc as the zinc source, and water vapor as the oxygen source. The sheet resistance of the ZnO layer was about 10 ohms per square. Solar cells of 0.09 cm$^2$ were isolated and characterized. FIG. 7 shows the current versus potential (I–V) characteristics of a typical device made by this method, having a conversion efficiency of about 7%. This result demonstrates that the method has the capacity to yield material with electronic properties suitable for the fabrication of active electronic devices.

EXAMPLE 5

Figure 8:
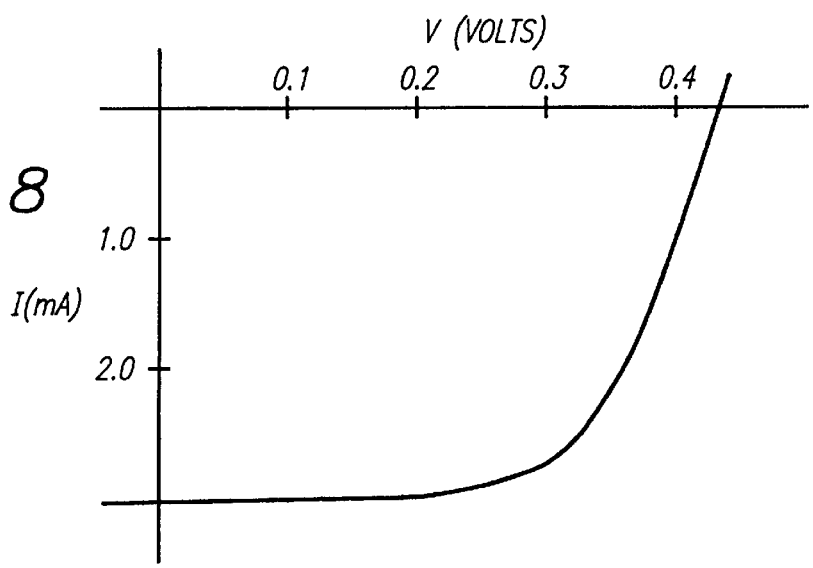
FIG. 8 illustrates the I–V characteristics of a solar cell, fabricated in accordance with another embodiment of the present invention.

In still another example, the melt atomization technique was used to obtain another starting material 20 powder with a Cu/In molar ratio of 0.87, and the powder was sieved as in Example 1. An ink source material 23 with the same Cu/In ratio was obtained after milling using this sieved powder, as described in the first example. This source material 23 was coated on a Mo-coated glass substrate (using the same off-the-shelf soda-lime glass material containing Na as in the first example), employing the same cup coating technique. The selenization step, as described in Example 1, was carried out and solar devices were fabricated as described above in Example 4. FIG. 8 shows the I–V characteristics of the obtained typical solar cell, with a conversion efficiency of 9.42%.

EXAMPLE 6

To demonstrate the doping of the compound films externally rather than through diffusion from the Na-containing glass, the following experiment was carried out.

The ink of Example 5 was coated on a glass/Mo substrate. This time the selected glass was Corning 7059 glass that contains no Na. By selecting a Na-free glass substrate, it was assured that any doping effect that may be observed would not be due to Na diffusing into the compound layer from the glass through the Mo contact layer.

Also, a six ml portion of the ink of Example 5 was put into a small tube and 42 mg of sodium acetate was dissolved in this ink. The doped ink was then coated on a glass/Mo substrate using the Corning 7059 glass.

Figure 9:
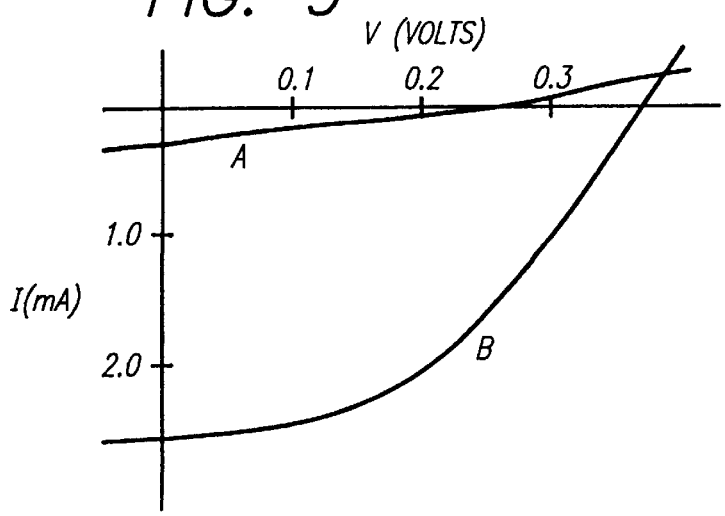
FIG. 9 illustrates the I–V characteristics of a solar cell, fabricated in accordance with yet another embodiment of the present invention.

The doped and undoped precursor layers were selenized as in Example 1. Devices were fabricated on both films as in Example 4. The results are shown in the two I–V curves shown in FIG. 9. The curve "A" device, made with the undoped compound film, is very poor with a conversion efficiency of less than 0.5%. This is due to the very high resistivity of the $CuInSe_2$ layer. The curve "B" device, made with the doped compound film, has drastically improved efficiency of 4.5% demonstrating the effectiveness of the extrinsic Na doping. Similar positive results apply using other Na dopant sources, such as sodium sulfate and sodium sulfide.

The basic method described certainly would be expected to be practical and provide significant positive results with a molar percent ratio of the Group IB element or elements to the Group IIIB element or elements in the compound film of greater than or equal to 0.5 and less than or equal to 1.0. As this ratio increases, the results should correspondingly improve, with greater than or equal to 0.80 and less than or equal to 1.0 typically more desirable. The use of doping, to some extent, can compensate for a lower-end ratio. Thus a I/III ratio, for example of 0.6 with doping, would be expected to provide results comparable to a significantly higher ratio with no doping. Also, as indicated already, a starting or intermediate ratio of greater than 1.0, but reduced to less than 1.0 by the end of, e.g., the annealing step may be provided, with a starting ratio up to 1.2 expected to be practical and provide significant positive results.

The methods described have a range of applicability, e.g., from solar cells for large-scale power generation, to components for miniature devices, such as medical sensors. Manufacturing large devices, at least one square foot and preferably four to eight square feet, would, based on the results, yield efficiencies as high as about 10% and at least 7%. Ultimately, efficiencies of 15% in large modules would be unsurprising.

For purposes of simplicity, the description has primarily focused on $CuInSe_2$ -based structures and compound films of the Group IB-IIIA-VIA type. However, it should be understood that the compound films of the Group IIB-IVA-VA-type and of the Group IB-VA-VIA-type may be substituted. The preferred elements from these groups are Cu from the Group IB, Ga and In from the Group IIIA, S,Se and Te from the Group VIA, Zn and Cd from the Group IIB, silicon (Si), germanium (Ge) and tin (Sn) from the Group IVA and P, arsenic (As), and Sb from the Group VA. The dopants preferred for the Group IB-IIIA-VIA materials are from Group IA, like Li, Na and K, and from Group VA like P, As, Sb and Bi, the dopant should be less than or equal to about 1 molar % of the material for which it substitutes as such a dopant.

It, of course, will be readily apparent that many changes and modifications may be made in the methods and devices described in detail, depending upon the particular circumstance and application, without departing from the spirit or scope of the invention, as defined by the claims that follow and their equivalents.

What is claimed is:

1. A method for forming a compound film, comprising the steps of:
    (a) preparing a source material including Group IB-IIIA alloy-containing particles having at least one Group IB-IIIA alloy phase, Group IB-IIIA alloys constituting greater than about 50 molar percent of the Group IB elements and greater than about 50 molar percent of the Group IIIA elements in said source material;
    (b) depositing said source material on a base in the form of a precursor film; and
    (c) heating said precursor film in a suitable atmosphere to form a film including a Group IB-IIIA-VIA compound.

2. A method for forming a compound film as defined in claim 1 wherein:
    the ratio by number of moles of Group IB to Group IIIA elements in said source material is greater than about 0.80 and less than about 1.0.

3. A method for forming a compound film as defined in claim 1 wherein:
    the ratio by number of moles of Group IB to Group IIIA elements in said source material is greater than 1.

4. A method for forming a compound film as defined in claim 3 wherein:
    the ratio by number of moles of Group IB to Group IIIA elements in said compound film is greater than about 0.80 and less than about 1.0.

5. A method for forming a compound film as defined in claim 1 wherein:
    Group IB-IIIA alloys constitute greater than about 60 molar percent of the Group IB elements and greater than about 60 molar percent of the Group IIIA elements in said source material.

6. A method for forming a compound film as defined in claim 1 wherein:
    Group IB-IIIA alloys constitute greater than about 90 molar percent of the Group IB elements and greater than about 90 molar percent of the Group IIIA elements in said source material.

7. A method for forming a compound film as defined in claim 1 wherein:
    said Group IB-IIIA alloy-containing particles have at least one Group IB or Group IIIA element phase.

8. A method for forming a compound film as defined in claim 1 wherein:
    said source material further includes particles having a Group IB element phase.

9. A method for forming a compound film as defined in claim 1 wherein:
    said source material further includes particles having a Group IIIA element phase.

10. A method for forming a compound film as defined in claim 1 wherein:
    said source material further includes Group VIA-containing particles.

11. A method for forming a compound film as defined in claim 1 wherein:
    the step of preparing a source material includes forming a powder including said Group IB-IIIA alloy-containing particles.

12. A method of forming a compound film as defined in claim 11 wherein:
    said powder substantially has particle sizes of less than about 20 microns.

13. A method of forming a compound film as defined in claim 11 wherein:

said powder substantially has particle sizes of less than about 2 microns.

14. A method of forming a compound film as defined in claim 1 wherein:
said precursor film has a single layer.

15. A method of forming a compound film as defined in claim 1 wherein:
said compound film has a thickness of greater than about 0.5 micron and less than about 20 microns.

16. A method of forming a compound film as defined in claim 15 wherein:
said compound film has a thickness of greater than about 1 micron and less than about 10 microns.

17. A method of forming a compound film as defined in claim 1 wherein the step of preparing a source material comprises:
providing a powder including Group IB-IIIA alloy-containing particles; and
forming an ink including Group IB-IIIA alloycontaining particles.

18. A method for forming a compound film as defined in claim 1 wherein:
said Group IB-IIIA alloy-containing particles contain Cu from Group IB and Group IIIA material selected from In or Ga.

19. A method for forming a compound film as defined in claim 18 wherein:
said Group IB-IIIA alloy-containing particles contain Group IIIA material including an alloy of In and Ga represented by the chemical formula $In_xGa_{(1-x)}$ wherein x is greater than 0 and less than 1.

20. A method for forming a compound film as defined in claim 1 wherein:
said Group IB-IIIA alloy-containing particles are dispersed throughout the source material.

21. A method for forming a compound film as defined in claim 1 wherein:
said alloy phase includes a dopant.

22. A method for forming a compound film as defined in claim 21 wherein:
said dopant is an element selected from the group of Na, K and Li.

23. A method for forming a compound film as defined in claim 1 wherein:
said source material includes a dopant.

24. A method for forming a compound film as defined in claim 1 wherein:
said compound film includes a dopant.

25. A method for fabricating an electronic device, comprising the steps of:
(a) preparing a source material including Group IB-IIIA alloy-containing particles having at least one Group IB-IIIA alloy phase, Group IB-IIIA alloys constituting greater than about 50 molar percent of the Group IB elements and greater than about 50 molar percent of the Group IIIA elements in said source material;
(b) depositing said source material on a base in the form of a precursor film;
(c) heating said precursor film in a suitable atmosphere to form a film including a Group IB-IIIA-VIA compound; and (d) providing an electrical contact structure for the electronic device.

26. A method of forming a compound film as defined in claim 25 wherein the step of preparing a source material comprises:
providing a powder including Group IB-IIIA alloy-containing particles; and
forming an ink including Group IB-IIIA alloy-containing particles.

27. A method for fabricating a solar cell, comprising the steps of:
(a) preparing a source material including Group IB-IIIA alloy-containing particles having at least one Group IB-IIIA alloy phase, Group IB-IIIA alloys constituting greater than about 50 molar percent of the Group IB elements and greater than about 50 molar percent of the Group IIIA elements in said source material;
(b) depositing said source material on a base in the form of a precursor film;
(c) heating said precursor film in a suitable atmosphere to form a film including a Group IB-IIIA-VIA compound; and
(d) providing a window layer of material for the solar cell to transmit solar radiation in the solar cell.

28. A method of forming a compound film as defined in claim 27 wherein the step of preparing a source material comprises:
providing a powder including Group IB-IIIA alloy-containing particles; and
forming an ink including Group IB-IIIA alloycontaining particles.

29. A method for forming a compound, comprising the steps of:
(a) preparing a source material including alloy-containing particles having at least one alloy phase selected from a Group IB-IIIA alloy phase, a Group IIB-IVA alloy phase and a Group IB-VA alloy phase, alloys of said selected Group constituting greater than about 50 molar percent of the first elements of said selected Group and greater than about 50 molar percent of the second elements of said selected Group, in said source material;
(b) depositing said source material on a base in the form of a precursor film; and
(c) heating said precursor film in a suitable atmosphere to form a film including a compound selected from a Group IB-IIIA-VIA compound for said selected Group IB-IIIA alloy phase, a Group IIB-IVA-VA compound for said selected Group IIB-IVA alloy phase and a Group IB-VA-VIA compound for said selected.

30. A method for forming a compound film as defined in claim 29 wherein:
alloys of said selected Group constitute greater than about 60 molar percent of the first elements of said selected Group and greater than about 60 molar percent of the second elements of said selected Group, in said source material.

31. A method for forming a compound film as defined in claim 29 wherein:
alloys of said selected Group constitute greater than about 90 molar percent of the first elements of said selected Group and greater than about 90 molar percent of the second elements of said selected Group, in said source material.

32. A method for forming a compound film as defiled in claim 29 wherein:
said alloy phase includes a dopant.

33. A method for forming a compound film as defined in claim 29 wherein: said source material includes a dopant.

34. A method for forming a compound film as defined in claim 29 wherein: said compound film includes a dopant.

35. A method for forming a compound film as defined in claim 1 wherein:
the ratio by number of moles of Group IB to Group IIIA elements in said source material is greater than 1.1.

* * * * *

UNITED STATES PATENT AND TRADEMARK OFFICE
CERTIFICATE OF CORRECTION

PATENT NO. : 5,985,691
DATED      : Nov. 16, 1999
INVENTOR(S) : Bulent M. Basol, Vijay K. Kapur, Arvind T. Halani, Craig R. Leidholm, Robert A. Roe It is certified that error appears in the above-identified patent and that said Letters Patent is hereby corrected as shown below: On the title page: Item [56]

under "OTHER PUBLICATIONS", first entry, change "CuIn", to read --CuIn--.

Column 10, line 2, change "less that", to read --less than--.

Column 14, line 34, change "thiorea", to read --thiourea--.

Column 14, line 39, change "HCL", to read --HCl--.

Column 17, line 53, claim 25, change "grcatcr, to read --greater--.

Column 18, line 41, claim 29, after "selected", add --Group IB-VA alloy phase--.

Signed and Sealed this

Twenty-third Day of May, 2000

Attest:

Q. TODD DICKINSON

*Attesting Officer*  *Director of Patents and Trademarks*